United States Patent [19]

Skudera, Jr.

[11] Patent Number: 5,383,222

[45] Date of Patent: Jan. 17, 1995

[54] FEEDBACK CIRCUITRY FOR RECREATING CW COMPONENTS FROM CHIRP-Z PULSES

[75] Inventor: William, J. Skudera, Jr., Oceanport, N.J.

[73] Assignee: The United States of America as represented by the Secretary of the Army, Washington, D.C.

[21] Appl. No.: 14,597

[22] Filed: Feb. 8, 1993

[51] Int. Cl.⁶ .................. H04B 3/46; H04B 17/00; H04B 15/00; H04Q 1/20
[52] U.S. Cl. .................................. 375/10; 375/1
[58] Field of Search .............. 375/10, 1; 324/76.35, 324/76.54, 76.22, 76.23

[56] References Cited

U.S. PATENT DOCUMENTS

H1331  7/1994  Skudera, Jr. .................. 324/76.23

OTHER PUBLICATIONS

W. J. Skudera, "Saw Tapped Delay Lines for New Potential Circuit Applications," 42nd Annual Frequency Control Symposium, pp. 252–258, 1988.

Primary Examiner—Stephen Chin
Assistant Examiner—Duane Kobayashi
Attorney, Agent, or Firm—Michael Zelenka; John M. O'Meara

[57] ABSTRACT

Stable feedback circuitry is disclosed for recreating selected CW components of a signal without distortion. Chirp-Z pulses relating to the CW component are continuously replicated at the rate necessary to separate the pulse replications by half the uniform Chirp-Z pulse duration.

3 Claims, 3 Drawing Sheets

FEEDBACK CIRCUITRY FOR RECREATING CW COMPONENTS FROM CHIRP-Z PULSES

GOVERNMENT INTEREST

The invention described herein may be manufactured, used, and licensed by or for the Government for governmental purposes without the payment to me of any royalties thereon.

BACKGROUND OF THE INVENTION

The present invention relates generally to signal spectrum analyzers and more particularly, to such analyzers wherein Chirp-Z forward transforms are utilized.

Conventional Chirp-Z signal analyzers utilize forward transforms to compress the individual continuous wave (hereinafter CW) components of the signal into segregated pulses or time intervals from which such components are then selectively reconstructed or expanded with inverse transforms. Considerable gain is inherent with Chirp-Z forward transforms, however, high attenuation is inherent with Chirp-Z inverse transforms. Consequently, Chirp-Z inverse transforms incumber the overall sensitivity of signal analyzers.

To avoid the high attenuation associated with Chirp-Z inverse transforms, selected CW components can be reconstructed from the Chirp-Z pulses relating thereto, by replicating each of those pulses for the time period separating therebetween. A disclosure regarding this technique entitled SAW Tapped Delay Lines For New Potential Circuit Applications, was published by William J. Skudera, Jr. in the Proceedings Of The 42ND Annual Symposium On Frequency Control 1988. In this disclosure, the replications of each pulse are separated by half the uniform Chirp-Z pulse duration and are derived with a tapped delay line (hereinafter TDL) that generates an initial group of replications which is enhanced in number by continual recirculation therethrough until the following Chirp-Z pulse appears. Such recirculation is accomplished through a feedback switch which functions to initiate the reconstruction process for each successive pulse. With each circulation however the number of pulse replications emitted from each tap of the TDL expands, so that some pulse replications stack upon others which causes increasing distortion and possible instability, as the number of recirculations increases.

SUMMARY OF THE INVENTION

It is the general object of the present invention to recreate selected CW components of a signal from Chirp-Z pulses relating thereto.

It is a specific object of the present invention to accomplish the above-stated general object with stable and distortion free feedback circuitry.

These and other objects are accomplished with the present invention wherein a feedback switch only recirculates pulse replications through a fixed delay line (hereinafter FDL) after an initial group of replications is derived from a TDL.

The scope of the present invention is only limited by the appended claims for which support is predicated on the preferred embodiments hereinafter set forth in the following description and the attached drawings wherein like reference characters relate to like circuit components throughout the several figures.

DESCRIPTION OF THE DRAWINGS

FIG. 2($b$) illustrates how the feedback circuitry in FIG. 1 ideally replicates Chirp-Z pulses relating to selected CW components for the time duration between such pulses.

FIG. 2($c$) illustrates the CW component recreation which results from the Chirp-Z pulse replications in FIG. 2($b$).

DESCRIPTION OF THE PREFERRED EMBODIMENTS

Figure 1:
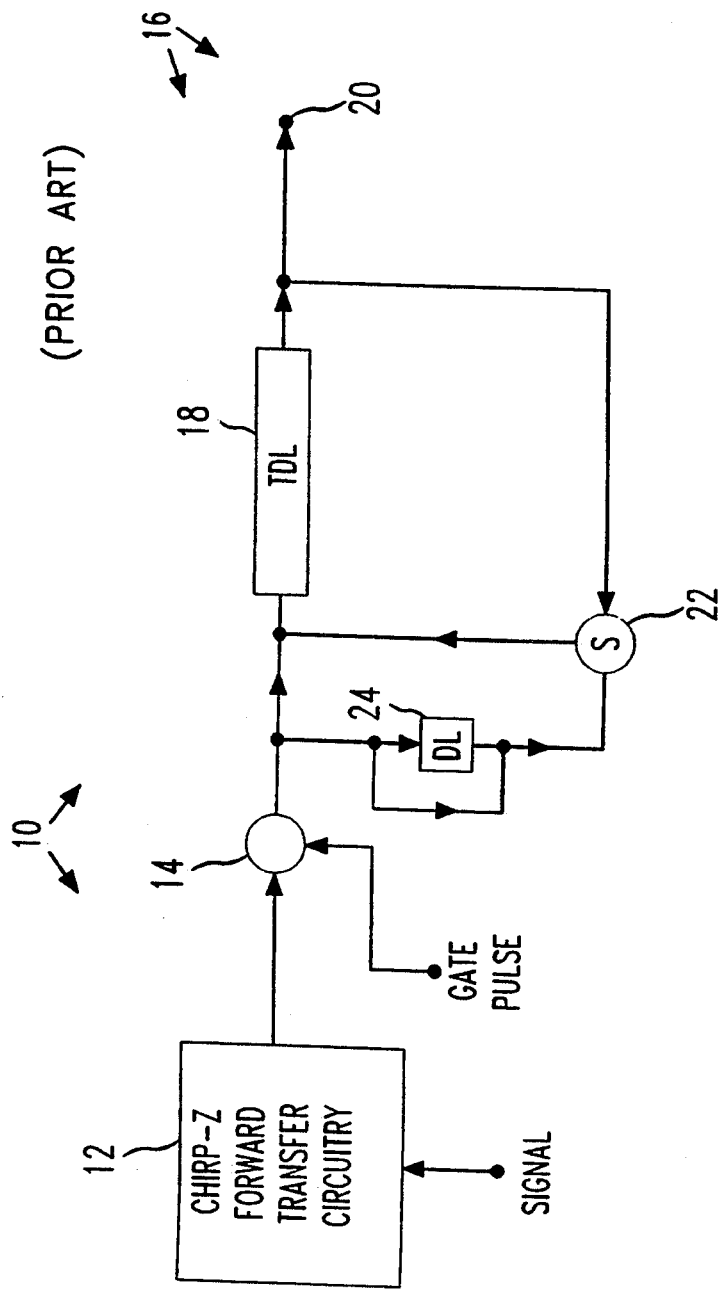
FIG. 1 is a block diagram illustration of a prior art Chirp-Z signal analyzer to which this invention relates.
Figure 2:
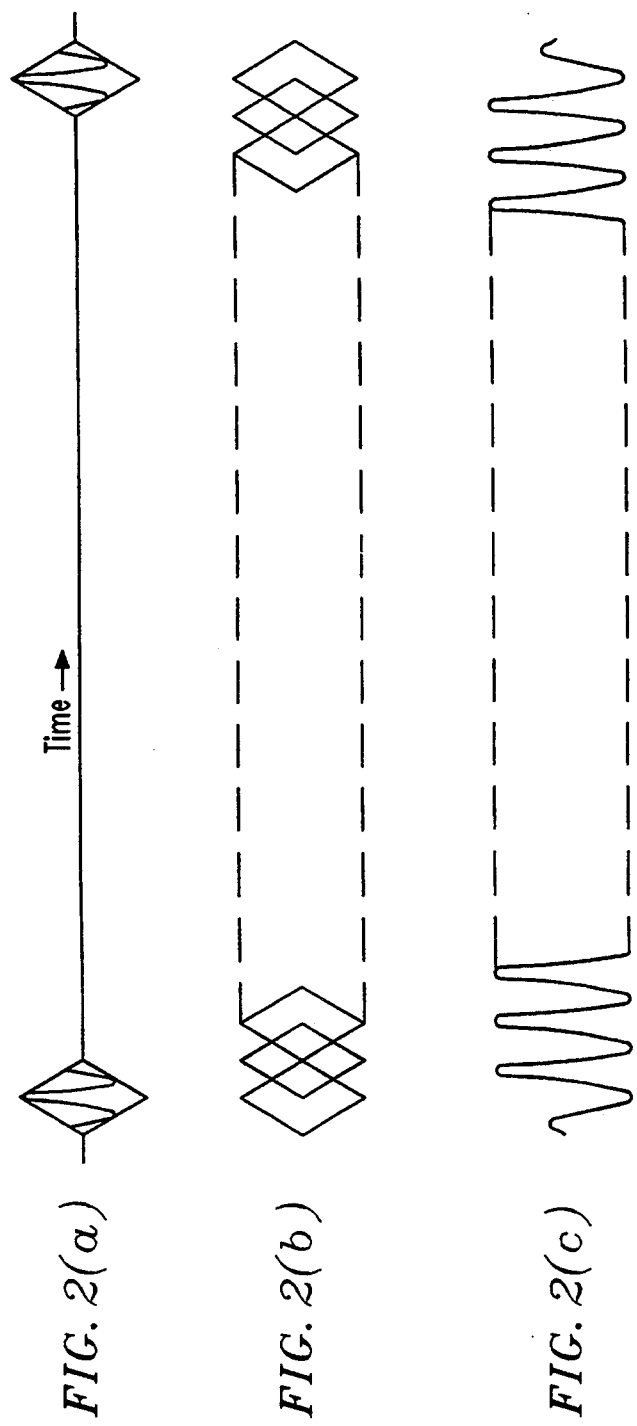
FIG. 2($a$) represents sequentially generated Chirp-Z pulses for one selected CW component.

In the prior art Chirp-Z signal analyzer 10 of FIG. 1, circuitry 12 derives forward Chirp-Z transforms for compressing the individual CW components of the signal into segregated pulses or time intervals of equal duration. Every CW component has a single frequency characteristic and a Chirp-Z pulse corresponding thereto appears once during each scan of a sweeping local oscillator (not shown). Each Chirp-Z pulse serves as an envelope update of the CW component to which it relates. Such envelopes have a diamond shape time profile, as shown in FIG. 2($a$) wherein sequential Chirp-Z pulses of a selected CW component, as derived from consecutive scans of the sweeping local oscillator, are represented. Use of Chirp-Z transforms has been well known, at least since R. M. Hays et al. presented SURFACE WAVE TRANSFORM ADAPTABLE PROCESSOR SYSTEM, pages 363–370 of the 1975 Ultrasonics Symposium Proceedings IEEE Catalogue No. 75 CHO 994-4SU which is incorporated by reference herein. Forward Chirp-Z transforms are conventionally derived by mixing the signal with the output of the sweeping local oscillator (hereinafter SLO) and compressing the result with filters to focus on the frequency characteristic of each CW component.

The Chirp-Z pulse corresponding to a selected CW component during each scan of the SLO passes to feedback circuitry 16 for recreating a selected CW component by repeatedly replicating that pulse until the next such pulse appears. This replicating is performed at a rate which separates the pulse replications by half the uniform duration of a Chirp-Z pulse. Modulator 14 is controlled by a gate pulse in accordance with the scan time of the SLO and directs consecutive Chirp-Z pulses that correspond with the selected CW component, to the feedback circuitry 16. A TDL 18 in the feedback circuitry 16 receives the Chirp-Z pulses individually and passes a replication of each such pulse from each tap thereon, to generate an initial group of replications. Taps on TDL 18 are separated in time by half the uniform Chirp-Z pulse duration and consequently, the pulse replications in that group are overlapping. The initial group of replications passes to an output 20 and also to a feedback switch 22 which passes those replications for recirculation through the TDL 18. During the first recirculation through the TDL 18, the initial group of replications passes from each tap thereon to generate an expanded group of replications. Again this expanded group of replications passes to the output 20 and also to the feedback switch 22 which passes those replications for another recirculation through the TDL 18. Such recirculations continue until the next Chirp-Z pulse relating to the selected CW component is admitted to the feedback circuitry 16 by the modulator 14. A shunted delay line (hereinafter DL) 24 is disposed between the gate terminal of feedback switch 22 and the output terminal of the modulator 14 to update the feedback circuitry 16 for each Chirp-Z pulse admitted thereto. The time delay of DL 24 equals the maximum time delay of TDL 18, so that each newly admitted Chirp-Z pulse arrives at the gate terminal of feedback switch 22 first through the shunt to turn it off and then through DL 24 to turn it back on. Consequently, whenever another Chirp-Z pulse is admitted to the feedback circuitry 16 by the modulator 14, passage of pulse replications from feedback switch 22 to TDL 18 ceases until all pulse replications relating to the previous Chirp-Z pulse have passed from TDL 18.

Therefore, between successive Chirp-Z pulses of a selected CW component, a continuous stream of pulse replications pass to output 20, as shown in FIG. 2(b). Because these pulse replications are separated by half the uniform Chirp-Z pulse duration, sequential replications overlap to align adjacent pulse replications in such a manner that the constant wave amplitude of the CW component is ideally recreated, as shown in FIG. 2(c). However, an expanded number of pulse replications passes from each tap on TDL 18 during each recirculation therethrough. Since the taps on TDL 18 are separated in time by half the uniform Chirp-Z pulse duration, any such expansion of recirculated pulse replications causes some of the pulse replications to appear stacked at the output 20. Of course, such stacking causes distortion in the recreated CW component, which increases with each recirculation of pulse replications through the TDL 18. Furthermore, the possibility of unstable operation increases with each such recirculation due to such stacking.

Figure 3:
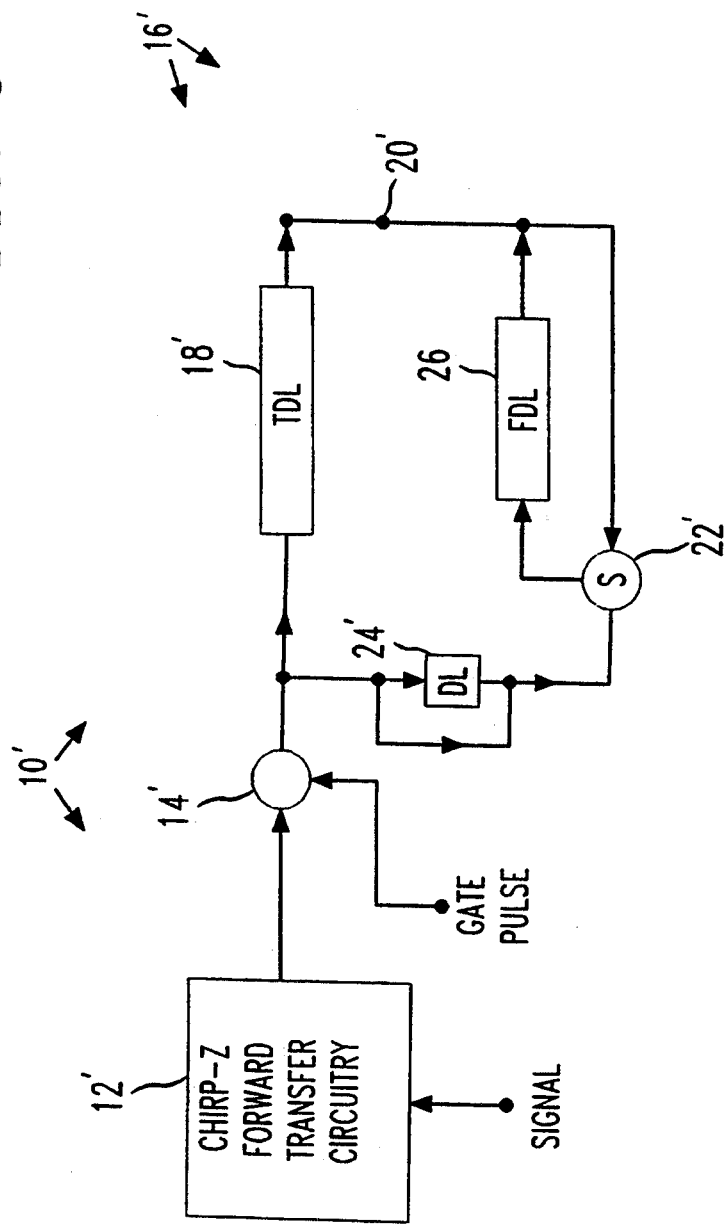
FIG. 3 is a block diagram illustration for the preferred embodiment of the invention.

The prior art Chirp-Z signal analyzer 10 of FIG. 1 is modified as shown FIG. 3 to resolve the stacking problem in the Chirp-Z signal analyzer 10' of the invention. As discussed previously regarding the FIG. 1 Chirp-Z analyzer, a Chirp-Z forward transform is utilized to compress the individual CW components of the signal into segregated pulses having a uniform duration in the FIG. 3 Chirp-Z signal analyzer 10'. Also, selected CW components are recreated in both of the analyzers 10 and 10' by replicating the individual Chirp-Z pulses that relate to the selected CW component, with a TDL 18 and from which a group of pulse replications separated by half the uniform Chirp-Z pulse duration, pass through a feedback switch 22 and 22' for recirculation. A fixed delay line (hereinafter FDL) 26 having a delay interval equal to the time duration occupied by that group of pulse replications, is disposed between the output of feedback switch 22' and the output of TDL 18' in the Chirp-Z analyzer 10' of the invention. Because the group of pulse replications is not recirculated through TDL 18' and the delay of FDL 26 equals the time duration occupied by the group of pulse replications, more than one pulse replication never occurs concurrently at the output 20'. Consequently, stacking of the pulse replications is avoided and each Chirp-Z pulse relating to the selected CW component is ideally replicated for the time duration until the next such pulse occurs, as shown in FIG. 2(b). Otherwise, the like circuit components in Chirp-Z signal analyzers 10 and 10' function in the manner previously described regarding the circuitry of FIG. 1.

Although amplifiers are not shown in FIGS. 1 and 3, they may be required at the output of all the delay lines to overcome insertion loss and provide signal isolation. Those skilled in the art will also understand that phase trimmers may be employed to account for any fabrication or tolerance errors which may occur in the circuit.

Those skilled in the art will appreciate without any further explanation, that within the concept of this invention many modifications and variations are possible to the above-disclosed embodiments of the signal analyzer circuitry. Consequently, it should be understood that all such modifications and variations fall within the scope of the following claims.

What I claim is:

1. In a signal analyzer wherein Chirp-Z forward transforms are utilized to compress the individual CW components of the signal into segregated pulses having a uniform duration and selected CW components are recreated by replicating the Chirp-Z pulses relating thereto with a TDL from which a group of pulse replications separated by half the uniform Chirp-Z pulse duration, pass through a feedback switch for recirculation, the improvement comprising:

a FDL having a delay interval equal to the time duration occupied by the group of pulse replications and output from the feedback switch is directed to only said FDL.

2. The analyzer of claim 1 wherein output from the TDL and output from said FDL are connected at a common node which is connected to an input of the feedback switch and from which the recreation of the selected CW component is outputed.

3. A signal analyzer for recreating selected CW components of a signal, comprising:

Chirp-Z forward transform circuitry for compressing individual CW components into segregated Chirp-Z pulses of uniform duration;

a TDL having an input and an output as well as a plurality of taps, said taps being separated by half the uniform Chirp-Z pulse duration;

a modulator for gating Chirp-Z pulses from said forward transform circuitry to said TDL input, with a group of replications for each gated Chirp-Z pulse being derived from said TDL output;

a FDL having a delay interval equal to the time duration occupied by said group of Chirp-Z pulse replications and having an input and an output, with said FDL output and said TDL output being interconnected at a common node;

a feedback switch having an input, an output and a control gate, said feedback switch input being connected at said common node and said feedback switch output being connected at said FDL input; and a DL having a delay interval equal to the maximum time delay of said TDL and having an input and an output with a shunt connected therebetween, said DL input being connected at said TDL input to also receive the Chirp-Z pulses from said forward transform circuitry and said DL output being connected at said feedback switch control gate, with each Chirp-Z pulse passing first through said shunt to turn off said feedback switch and then through said DL to turn on said feedback switch so that no pulse replications pass from said feedback switch output until all previous Chirp-Z pulse replications have passed from said common node;

the selected CW component being recreated at said common node where replications of the gated Chirp-Z pulse are continuously presented, with adjacent pulse replications overlapped in such a manner that the constant wave amplitude of the CW component is presented until the subsequent Chirp-Z pulse is gated to said TDL.

* * * * *